(12) United States Patent
Miyoshi et al.

(10) Patent No.: US 6,214,126 B1
(45) Date of Patent: *Apr. 10, 2001

(54) METHOD FOR CLEANING A SILICON SUBSTRATE

(75) Inventors: Yuichi Miyoshi, Neyagawa; Michikazu Matsumoto, Moriguchi; Teruhito Ohnishi, Hirakata, all of (JP)

(73) Assignee: Matsushita Electric Industrial Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/744,688

(22) Filed: Nov. 7, 1996

Related U.S. Application Data

(63) Continuation of application No. 08/337,735, filed on Nov. 14, 1994, now abandoned.

(30) Foreign Application Priority Data

Nov. 15, 1993 (JP) .................................................... 5-284821

(51) Int. Cl.$^7$ .................................................. C23G 23/00
(52) U.S. Cl. .................................. 134/2; 134/18; 134/902
(58) Field of Search .................................. 134/2, 19, 40, 134/1, 1.3, 26, 29, 18, 902

(56) References Cited

U.S. PATENT DOCUMENTS 5,176,756 * 1/1993 Nakashima et al. ..................... 134/2

FOREIGN PATENT DOCUMENTS

| 61-281532 | 12/1986 | (JP) . |
| 2159029 | 6/1990 | (JP) . |
| 5166781 | 7/1993 | (JP) . |
| 5259141 | 10/1993 | (JP) . |

OTHER PUBLICATIONS

Kern et al, *RCA Review*, "Cleaning Solutions Based on Hydrogen Peroxide for Use in Silicone Semiconductor Technology", vol. 31, No. 2, Jun. 1970, pp 178–206.
Handbook of Semicondutor Wafer Cleaing Technology, Noyes Publications, pp. 44–48 and 122, 1993.*

* cited by examiner

Primary Examiner—Alexander Markoff
(74) Attorney, Agent, or Firm—Renner, Otto, Boisselle & Sklar, LLP

(57) ABSTRACT

A silicon substrate is cleaned using a liquid mixture primarily containing ammonia and hydrogen peroxide. A liquid containing ammonia is added to the liquid mixture to maintain the concentration of ammonia in the liquid mixture applied to the silicon substrate in the range between 2.5 wt. % and 3.5 wt. %. The liquid containing ammonia is added to the liquid mixture at a constant time interval. The constant time interval is set to be equal to a time period which is necessary for the concentration of ammonia in the liquid mixture to change from a first concentration level of no more than 3.5 wt. % to a second concentration level of no less than 2.5 wt. %, the second concentration level being lower than the first concentration level. The concentration of ammonia in the liquid containing ammonia and the amount thereof to be added to the liquid mixture are adjusted so as to increase the concentration of ammonia in the liquid mixture to the first concentration level by addition thereof.

7 Claims, 6 Drawing Sheets

METHOD FOR CLEANING A SILICON SUBSTRATE

This is a continuation of application(s) Ser. No. 08/337,735 filed on Nov. 14, 1994, now abandoned.

BACKGROUND OF THE INVENTION

1. Field of the Invention

The present invention relates to a method for cleaning a silicon substrate used for production of VLSIs.

2. Description of the Related Art

In the production of VLSIs, a liquid mixture of ammonia, hydrogen peroxide and water (hereinafter, referred to as an "ammonia/hydrogen peroxide cleaning liquid" or simply as a "cleaning liquid") is generally used for removing particles of silicon and silicon oxide adhering to a silicon substrate. When ammonia in the ammonia/hydrogen peroxide cleaning liquid etches the particles, the silicon substrate is also etched. Accordingly, non-soluble particles formed of, for example, resins such as TeflonR adhering to the silicon substrate are removed.

Recently, for the purpose of achieving higher integration of VLSIs, reduction in the size of the chips and in the thickness of the gate oxide film of the transistors is an important matter of research. In order to realize such reduction, the parameters in all the steps of the VLSIs production should be precisely controlled. For example, it is necessary that cleaning performed before the formation of a thin oxide film on the silicon substrate should be done in such a manner that the thickness of the film formed by natural oxidization after the cleaning will be accurately controlled. In the cleaning performed after the formation of a gate oxide film having a thickness of as small as several nanometers, slight fluctuations in the etching rate of the oxide film of approximately several tens of nanometers per minute presents a problem. Under these circumstances, cleaning parameters such as the thickness of the film formed by natural oxidization and the etching rate of the gate oxide film should be precisely controlled in addition to the ability of removing the particles.

Conventionally, a silicon substrate is cleaned by use of an ammonia/hydrogen peroxide cleaning liquid in the following manner.

A reagent of 30 wt. % aqueous solution of ammonia, a reagent of 29 wt. % aqueous solution of hydrogen peroxide, and water are mixed in a volume ratio of 1:1:5 in a bath to obtain a liquid mixture containing ammonia at a concentration of 4.3 wt. % and hydrogen peroxide at a concentration of 4.1 wt. %. The resulting liquid mixture is heated to a prescribed temperature. Thereafter, the silicon substrate is immersed in the resulting liquid mixture for a prescribed period of time, is rinsed with pure water, and is dried. Regarding such a method, refer to, for example, W. Kern et al., *RCA Review*, page 207 (1970).

Briefly referring to FIG. 6, characteristics of such a conventional method will be described. FIG. 6 is a graph illustrating the concentrations of ammonia and hydrogen peroxide in the conventional ammonia/hydrogen peroxide cleaning liquid changing in accordance with time at a temperature of 60° C. Since ammonia is volatile in the ammonia/hydrogen peroxide cleaning liquid, the concentration of ammonia reduces in accordance with time, thereby changing the composition of the cleaning liquid. As is described in, for example, Japanese Laid-Open Patent Publication Nos. 2-159029 and 5-259141, the etching rate of a silicon oxide film depends on the concentration of ammonia in the conventional ammonia/hydrogen peroxide cleaning liquid. Accordingly, in the conventional ammonia/hydrogen peroxide cleaning liquid, the etching rate of the silicon oxide film changes due to the reduction in the concentration over time.

As is described above, the particles of silicon or silicon oxide adhering to the silicon substrate are removed by ammonia. Accordingly, the ability of removing the particles is higher as the concentration of ammonia is higher.

In the conventional ammonia/hydrogen peroxide cleaning liquid, the concentration of ammonia is initially sufficiently high to remove the particles but decreases in accordance with time. Since it is conventionally considered that a lower concentration of ammonia reduces the ability of removing the particles, the ammonia/hydrogen peroxide cleaning liquid is abolished after a certain period of time, and another bath of cleaning liquid is newly produced. Such a method increases the costs for the chemicals. Further, the cleaning parameters cannot be maintained constantly as the concentration of ammonia will always continue to reduce after the new bath of cleaning liquid is produced.

In an attempt to solve the above-described problem, Japanese Laid-Open Patent Publication No. 2-159029 describes a method for maintaining the concentration of ammonia in the ammonia/hydrogen peroxide cleaning liquid in the vicinity of 4.3 wt. % by adding the reagent of aqueous solution of ammonia in a prescribed amount at a prescribed time interval, thus keeping the cleaning characteristics at a constant level. However, when the concentration of ammonia is in the vicinity of 4.3 wt. %, the cleaning characteristics change drastically in correspondence with the concentration of ammonia. Accordingly, the cleaning characteristics significantly change by even slight fluctuations in the amount of the aqueous solution of ammonia added. For this reason, it is very difficult to control the concentration of ammonia by this method.

Japanese Laid-Open Patent Publication No. 2-159029 also describes a method in which the concentration of at least one of the components of the cleaning liquid is measured, and the necessary component is added in a necessary amount when necessary. It is described in this publication that the measurement of the concentration should be performed after the added component is mixed with the cleaning liquid uniformly. The measurement performed immediately after the addition does not present an accurate concentration since it takes a certain length of time for the added component to be mixed with the cleaning liquid uniformly. By the time the added component is uniformly mixed, the concentration of the component is already reduced by volatilization. Further, until the added component is uniformly mixed, the concentration of the component in the cleaning liquid bath is not uniform, thereby causing non-uniform etching on one same surface of the silicon substrate and also among a plurality of silicon substrates. The problem of non-uniform etching becomes more serious as the silicon substrate is increased in size.

SUMMARY OF THE INVENTION

A method for cleaning a silicon substrate using a liquid mixture primarily containing ammonia and hydrogen peroxide according to the present invention includes the step of adding a liquid containing ammonia to the liquid mixture to maintain the concentration of ammonia in the liquid mixture applied to the silicon substrate in the range between 2.5 wt. % and 3.5 wt. %.

In one embodiment of the invention, a method for cleaning a silicon substrate further includes the steps of measuring the concentration of ammonia in the liquid mixture before applying the liquid mixture to the silicon substrate; adding the liquid-containing ammonia, when the concentration of ammonia is less than a prescribed level, to increase the concentration of ammonia to a level within the range between a first concentration level of no more than 3.5 wt. % and a second concentration level of no less than 2.5 wt. %, the second concentration level being lower than the first concentration level; and following the measuring and adding steps, applying the liquid mixture to the silicon substrate.

Thus, the invention described herein makes possible the advantage of providing a method for cleaning a silicon substrate by which cleaning characteristics can be easily maintained at a constant level while keeping the cost low with no necessity of abolishing the cleaning liquid.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Referring to FIGS. 1 through 4 and 7, a method for cleaning a silicon substrate in a first example according to the present-invention will be described.

A reagent of 30 wt. % aqueous solution of ammonia, a reagent of 29 wt. % aqueous solution of hydrogen peroxide, and water are mixed in a bath in such a ratio as to prepare a liquid mixture containing ammonia at a concentration of 3.5 wt. % and hydrogen peroxide at a concentration of 4 wt. %. For example, when the total amount of the liquid mixture is 18 liters, 2.1 liters of the reagent of aqueous solution of ammonia, 2.4 liters of the reagent of aqueous solution of hydrogen peroxide, and 13.5 liters of water are mixed. The resultant liquid mixture is heated up to a prescribed temperature, for example, 60° C. while circulated by a pump. Heated water may be mixed with the liquid mixture to obtain the prescribed temperature, instead. When the prescribed temperature is obtained, preparation of an ammonia/hydrogen peroxide cleaning liquid is completed. Next, the ammonia/hydrogen peroxide cleaning liquid is applied to a silicon substrate to be cleaned. For example, the silicon substrate is immersed in the ammonia/hydrogen peroxide cleaning liquid and is taken out after a prescribed period of time, for example, 10 minutes. Then, the silicon substrate is rinsed and dried.

Figure 1:
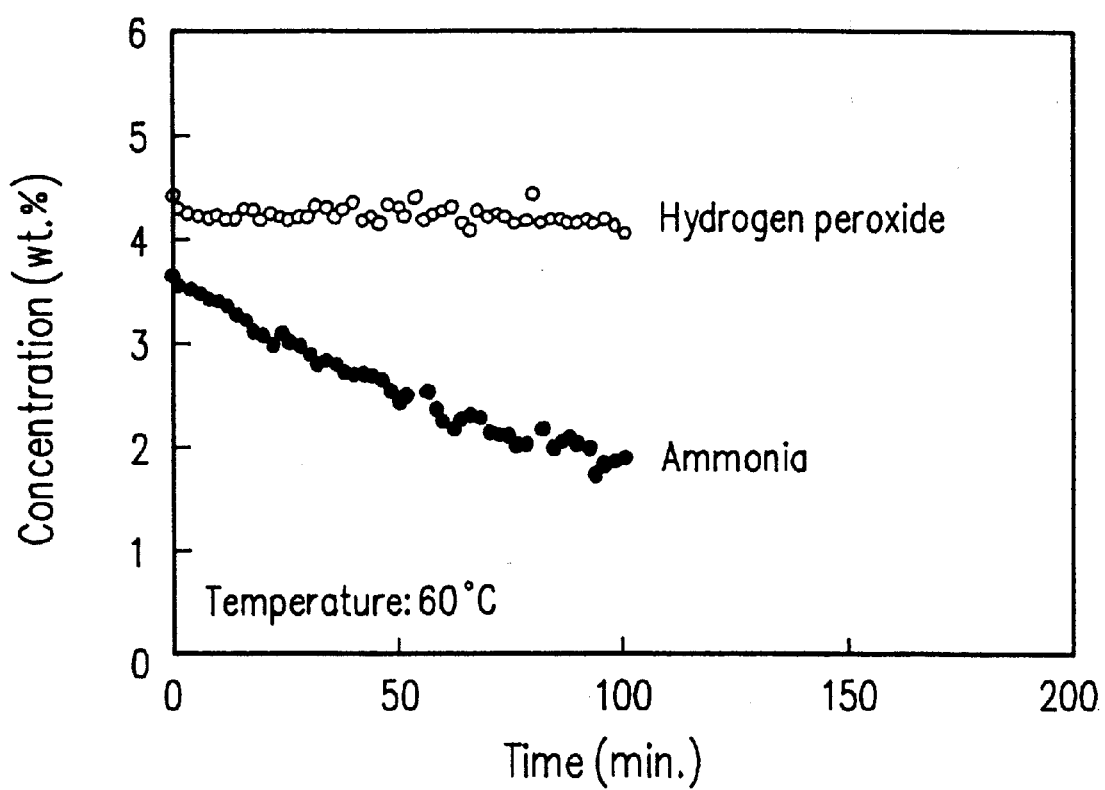
FIG. 1 is a graph illustrating the concentrations of ammonia and hydrogen peroxide changing in accordance with time in an ammonia/hydrogen peroxide cleaning liquid obtained by a method for cleaning a silicon substrate in a first example according to the present invention.
Figure 2:
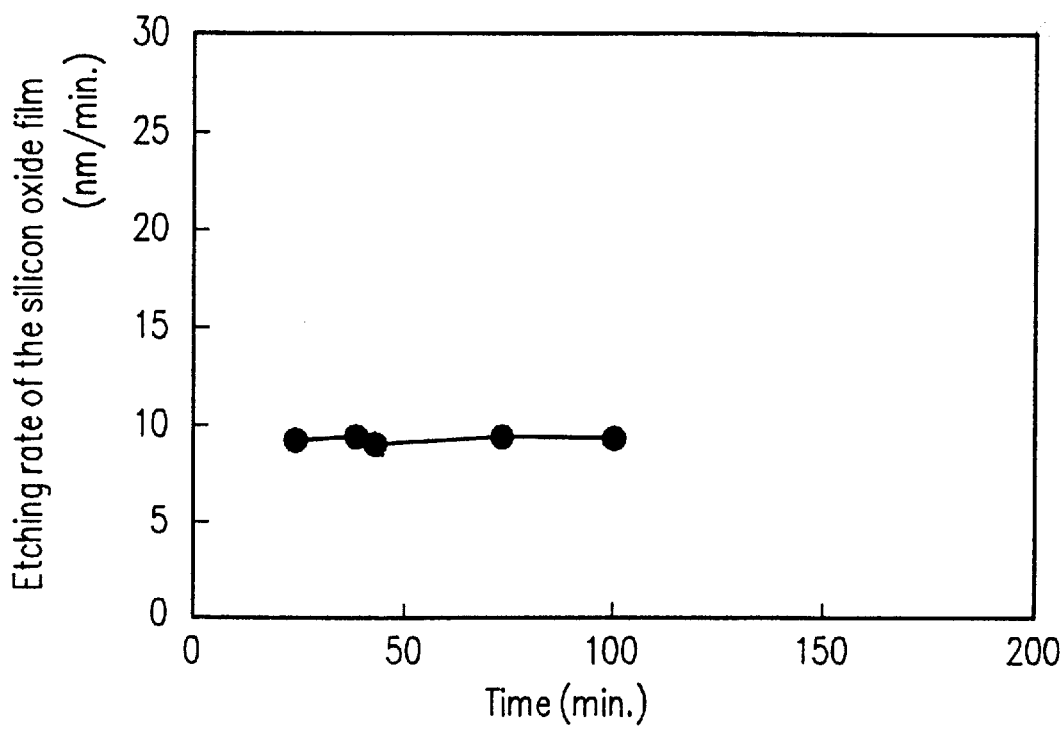
FIG. 2 is a graph illustrating the etching rate of a silicon oxide film in relation with time in accordance with the first example.

FIG. 1 is a graph illustrating the concentrations of ammonia and hydrogen peroxide changing in accordance with time. FIG. 2 is a graph illustrating the etching rate of a silicon oxide film changing in relation with time. The concentration of ammonia, which is volatile, gradually reduces along with time. Nevertheless, the etching rate is maintained at approximately 9 nm/minute.

Figure 7:
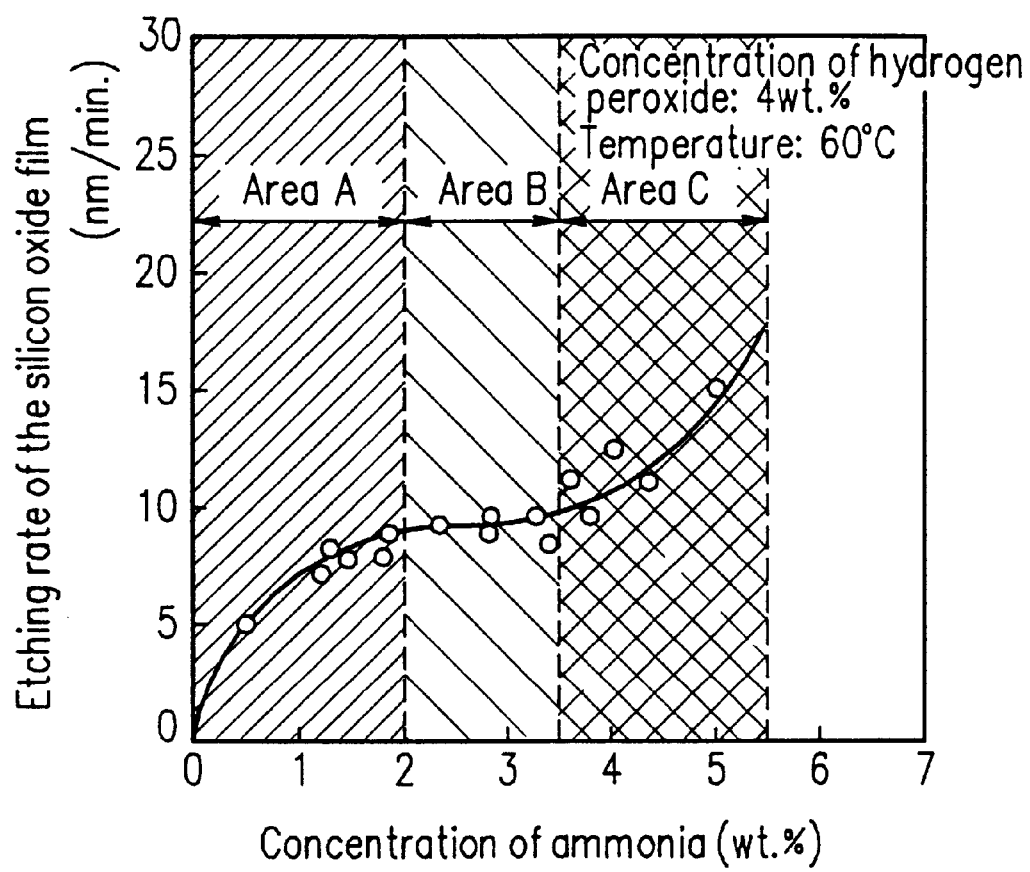
FIG. 7 is a graph illustrating the dependency of the etching rate of a silicon oxide film on the concentration of ammonia in an ammonia/hydrogen peroxide cleaning liquid.

The etching of the silicon oxide film is performed mainly in two stages. In a first stage, ammonium ions, which carry out etching, are diffused in the ammonia/hydrogen peroxide cleaning liquid to reach a surface of the silicon oxide film; and in a second stage, the ammonium ions and the silicon oxide film react to each other. The inventors of the present invention have found that, as is shown in FIG. 7, the etching rate of a silicon oxide film is maintained at a substantially constant level when the concentration of ammonia in an ammonia/hydrogen peroxide cleaning liquid is within the range between 2.0 wt. % and 3.5 wt. % (area B), whereas the etching rate changes in accordance with the concentration of ammonia when the concentration is less than 2.0 wt. % (area A) or more than 3.5 wt. % (area C). When the concentration is between 2.0 wt. % and 3.5 wt. %, the ammonium ions reach the surface of the silicon oxide film in a sufficient amount, and thus the etching rate is maintained at a constant level by the reaction of the ammonium ions and the silicon oxide film without depending on the concentration of ammonia in the cleaning liquid. As a result, stable cleaning characteristics are obtained.

Figure 3:
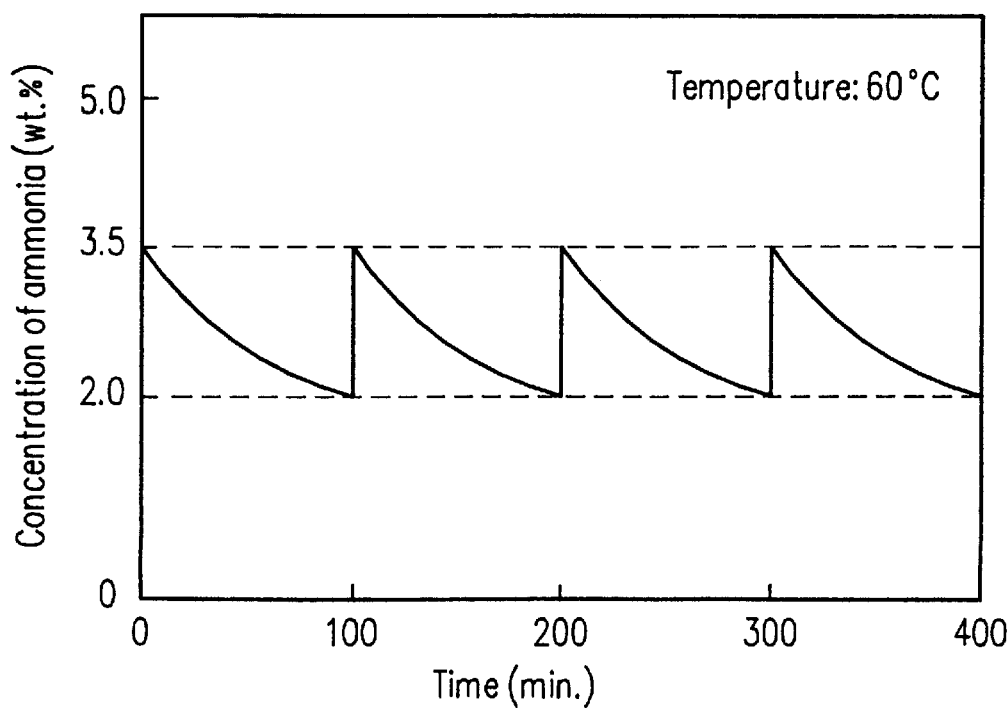
FIG. 3 is a graph conceptually illustrating the concentration of ammonia in the ammonia/hydrogen peroxide cleaning liquid when ammonia is added repeatedly in accordance with the first example.

After approximately 100 minutes, the concentration of ammonia becomes 2.0 wt. % or less. At this point, the reagent of 30 wt. % aqueous solution of ammonia is added in a prescribed amount, for example, in 1.0 liter with respect to the cleaning liquid of 18 liters. As a result, the concentration of ammonia returns to 3.5 wt. %, and the stable cleaning characteristics are kept for another 100 minutes. FIG. 3 is a graph conceptually illustrating the concentration of ammonia in the ammonia/hydrogen peroxide cleaning liquid when such addition is repeated every 100 minutes. As is easily appreciated from FIG. 3, the concentration of ammonia goes back and forth between 3.5 wt. % and 2.0 wt. %. As is illustrated in FIGS. 2 and 7, the etching rate is maintained at approximately 9 nm/minute as long as the concentration of ammonia is kept within this range.

The concentration of ammonia is preferably maintained between 2.5 wt. % and 3.5 wt. % in order to control the concentration with a sufficient margin.

Figure 4:
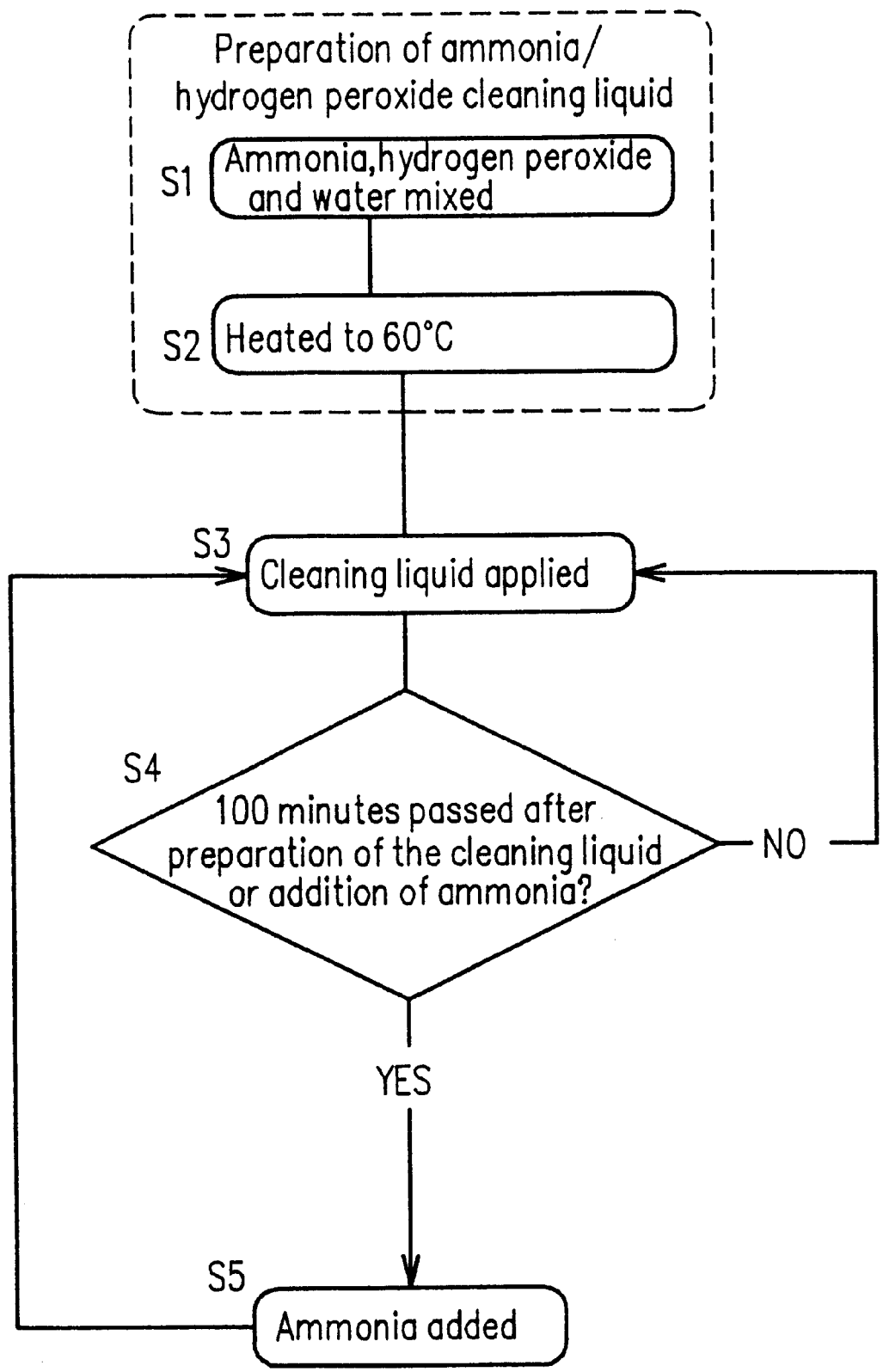
FIG. 4 is a flowchart illustrating a method for controlling the concentration of ammonia in accordance with the first example.

FIG. 4 is a flowchart showing a method for controlling the concentration of ammonia in accordance with the first example. In step S1, the reagents of aqueous solution of ammonia and aqueous solution of hydrogen peroxide are mixed with water to obtain a liquid mixture containing the ammonia and hydrogen peroxide at concentrations of 3.5 wt. % and 4 wt. %, respectively. In step S2, the liquid mixture is heated up to 60° C. to prepare an ammonia/hydrogen peroxide cleaning liquid. In step S3, the ammonia/hydrogen peroxide cleaning liquid is applied to a substrate. A hundred minutes after the preparation of the cleaning liquid (step S4), the reagent of aqueous solution of ammonia is added to increase the concentration of ammonia back to 3.5 wt. % (step S5). By simply adding the reagent of aqueous solution of ammonia every 100 minutes, stable cleaning characteristics and long life of the cleaning liquid can be realized.

The method in the first example is useful in the condition that the concentration of ammonia changes from 3.5 wt. % to 2.0 wt. % in 100 minutes. In such a method, the concentration of ammonia is controlled only by measuring the time, and the costs for the control equipment is reduced. The time period in which the concentration of ammonia changes from 3.5 wt. % to 2.0 wt. % depends on the shape of the bath containing the cleaning liquid, the surface area of the interface between the air and the cleaning liquid, the temperature of the cleaning liquid, and the like. Accordingly, it is necessary to measure the time period in advance.

EXAMPLE 2

Figure 5:
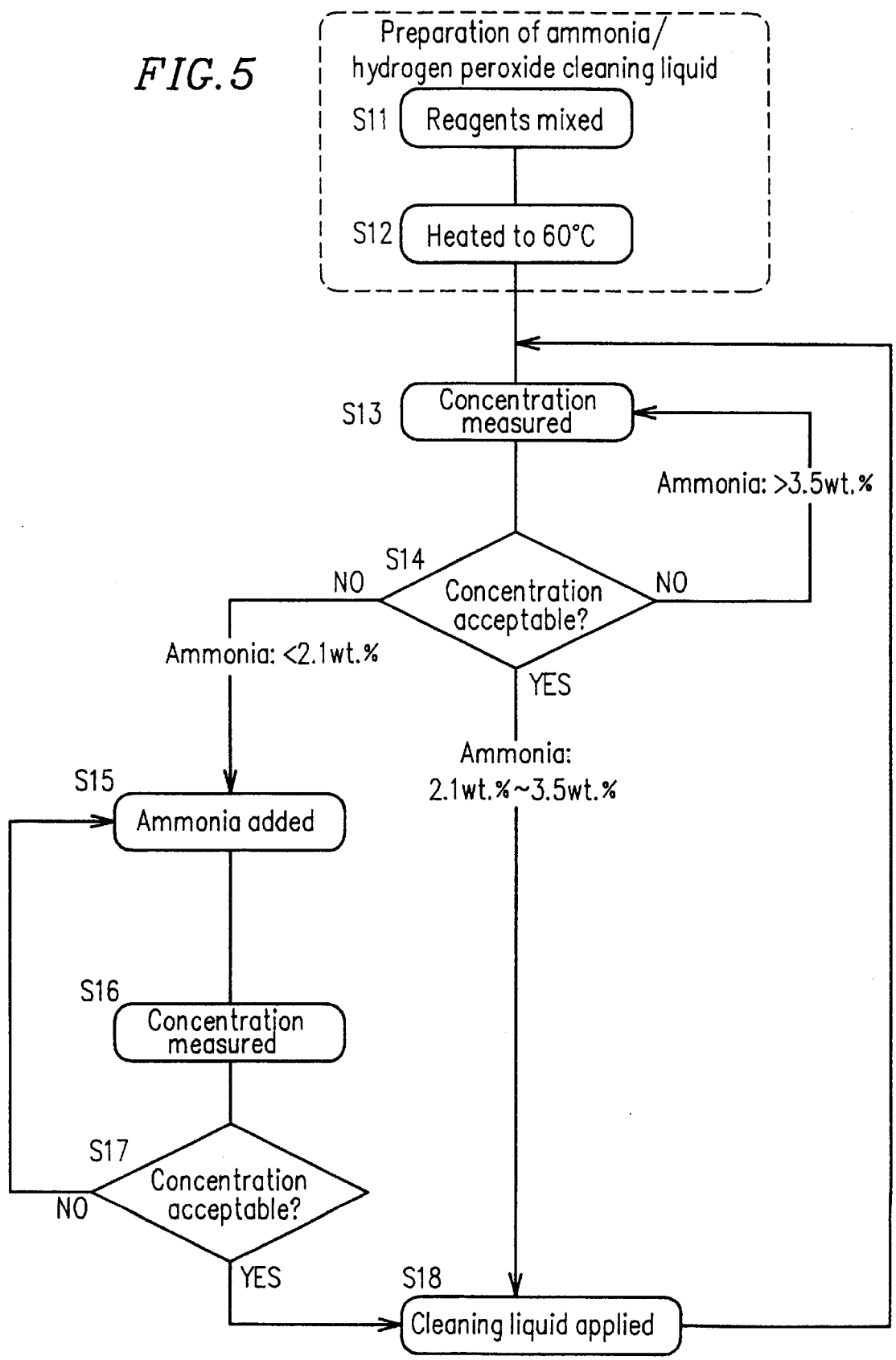
FIG. 5 is a flowchart illustrating a method for cleaning a silicon substrate in a second example according to the present invention.
Figure 6:
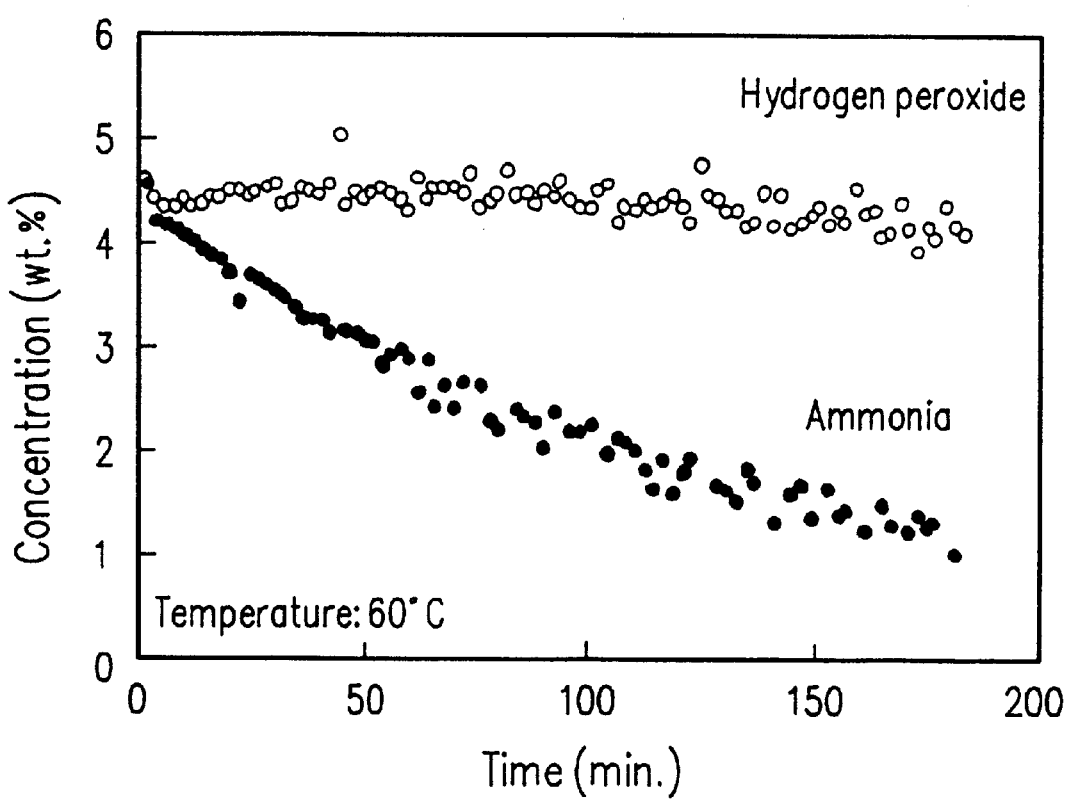
FIG. 6 is a graph illustrating the concentrations of ammonia and hydrogen peroxide changing in accordance with time in a conventional ammonia/hydrogen peroxide cleaning liquid.

With reference to FIG. 5, a method for cleaning a silicon substrate in a second example according to the present invention will be described. As described above, the method in the first example is useful in the case when the concentration of ammonia changes from 3.5 wt. % to 2.0 wt. % in a constant period of time. In the case when the temperature or the amount of the cleaning liquid, or other parameters change significantly, the time period in which the concentration of ammonia changes from 3.5 wt. % to 2.0 wt. % varies. Accordingly, the method in accordance with the first example is not suitable to such a case.

In the method in the second example, a concentration measuring apparatus described in, for example, Japanese Laid-Open Patent Publication No. 2-159029 is used. FIG. 5 is a flowchart illustrating the method in accordance with the second example.

The method in the second example is identical with the method in the first example up to the heating of the ammonia/hydrogen peroxide cleaning liquid to a prescribed temperature (steps S11 and S12). Immediately prior to application of the cleaning liquid to the silicon substrate, for example, several minutes prior to the application, the cleaning liquid is collected from the bath to measure at least the concentration of ammonia (step S13). In the case that the measurement is performed using optical absorption as is disclosed in Japanese Laid-Open Patent Publication No. 61-281532, the cleaning liquid can be returned to the bath after the measurement. In step S14, whether the measurement result is acceptable or not is determined. The cleaning liquid is acceptable if the concentration of ammonia is in the range between 2.1 wt. % and 3.5 wt. %. The lower limit is set for 2.1 wt. % instead of 2.0 wt. % in order to prevent the concentration of ammonia from becoming below 2.0 wt. % at the end of the cleaning.

If the cleaning liquid is in the above-described acceptable range in step S14, the cleaning liquid is applied to the silicon substrate (step S18). If the concentration of ammonia is lower than 2.1 wt. %, the reagent of aqueous solution of ammonia is added in such an amount as to raise the concentration to 3.5 wt. % (step S15). For example, when the total amount of the cleaning liquid is 18 liters and ammonia is contained at a concentration of 1.5 wt. %, the reagent of aqueous solution of ammonia is added in the amount of 1.4 liters. After the added amount of ammonia is mixed uniformly in the cleaning liquid, the cleaning liquid is collected again for measurement (step S16) to check if the concentration is within the acceptable range (step S17). If so, the cleaning liquid is applied to the silicon substrate (step S18). If not, the reagent of aqueous solution of ammonia is further added (step S15) until the concentration reaches the acceptable range.

The time period which is necessary for the added amount of ammonia to be mixed in the cleaning liquid uniformly is determined by measurement in advance. In an alternative manner, it is confirmed that the added amount of ammonia is uniformly mixed by measuring the concentration of ammonia every several minutes. If the concentration is within the acceptable range several times successively, it is determined that ammonia is uniformly mixed, and the cleaning liquid is applied to the silicon substrate.

If the concentration of ammonia is higher than 3.5 wt. % by an accident or the like in step S14, the cleaning liquid is collected and measured for the concentration of ammonia (step S13) until the concentration of ammonia is reduced as a result of volatilization. After the concentration of ammonia falls to within the acceptable range, the cleaning liquid is applied to the silicon substrate (step S18).

In the method in the second example, it is confirmed that the concentration of ammonia is in the acceptable range before the application to the cleaning liquid to the silicon substrate. Apparently, uniform cleaning and etching can be obtained in one same surface of a silicon substrate and among a plurality of silicon substrates. Further, since the concentration is measured only before the application of the cleaning liquid to the silicon substrate, it is not necessary to operate the concentration measuring apparatus between the applications or during the application. Accordingly, one concentration measuring apparatus can be connected to a plurality of baths for the cleaning liquid and switched as necessary. In this manner, the cleaning liquid in a plurality of cleaning liquid baths can be monitored by one concentration measuring apparatus.

It has been confirmed that the concentration of ammonia changes from 3.5 wt. % to 2.0 wt. % in approximately 100 minutes. Accordingly, instead of measuring the concentration before the application of the cleaning liquid, the concentration of ammonia may be measured after 50 minutes. At this point, the reagent of aqueous solution of ammonia is added so as to increase the concentration of ammonia back to 3.5 wt. %. The same effects are obtained.

In the second example also, the concentration of ammonia is preferably kept between 2.5 wt. % and 3.5 wt. % in order to control the concentration with a sufficient margin.

In the second example, the concentration is measured only immediately before the application of the cleaning liquid to the silicon substrate. It is also possible to measure the concentration during the application. In this manner, accidental generation of an abnormal concentration can be avoided, and thus defective cleaning can be avoided.

As has been described so far, according to the present invention, the concentration of ammonia in an ammonia/hydrogen peroxide cleaning liquid is controlled to be within the range between 2.5 wt. % and 3.5 wt. %. In this manner, highly uniform cleaning characteristics can be obtained in one same surface of a silicon substrate and among a plurality of silicon substrates even if the composition of the cleaning liquid changes. Further, since the control of the concentration of ammonia is performed with a sufficient margin, the control is easy. As a result, life of the cleaning liquid can be extended, and thus the overall cost for cleaning a silicon substrate can be lowered.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for cleaning a surface of a silicon substrate having a silicon oxide film formed on the surface using a liquid mixture primarily containing ammonia and hydrogen peroxide, the method comprising the steps of:

adding an ammonia solution to the liquid mixture to obtain a first ammonia concentration in the liquid mixture of 3.5 wt. %, wherein the ammonia solution is added to the liquid mixture at a constant time interval, the constant time interval is set to be equal to a time period which is necessary for the concentration of ammonia in the liquid mixture to change from the ammonia first concentration of 3.5 wt. % to a second ammonia concentration level of 2.5 wt. % and wherein the concentration of ammonia in the ammonia solution and the amount thereof added to the liquid mixture maintain a constant etch rate of the silicon oxide film; and applying the liquid mixture to the silicon substrate.

2. A method for cleaning a silicon substrate according to claim 1, wherein the ammonia solution is an aqueous solution of ammonia.

3. A method for cleaning a silicon substrate according to claim 1, further comprising the step of:

measuring the concentration of ammonia in the liquid mixture; and following the measuring step, applying the liquid mixture to the silicon substrate.

4. A method for cleaning a silicon substrate according to claim 1, wherein the concentration of ammonia in the ammonia solution and the amount thereof to be added are adjusted so as to increase the concentration of ammonia in the liquid mixture to the first ammonia concentration by addition of the ammonia solution to the liquid mixture.

5. A method for cleaning a silicon substrate according to claim 3, wherein the ammonia solution is an aqueous solution of ammonia.

6. A method for cleaning a surface of a silicon substrate having a silicon oxide film formed on the surface using a liquid mixture containing primarily ammonia and hydrogen peroxide, the method comprising the steps of:

adding an ammonia solution to the liquid mixture to obtain a first ammonia concentration in the liquid mixture of 3.5 wt. %;

cleaning the silicon substrate using the liquid mixture, until the cleaning causes a change in the ammonia concentration to a second ammonia concentration in the liquid mixture of 2.5 wt. %; and repeating the adding and cleaning steps, wherein the liquid mixture provides stable cleaning characteristics and maintains a constant etch rate of the silicon oxide film.

7. A method for cleaning a surface of a silicon substrate having a silicon oxide film formed on the surface using a liquid mixture containing primarily ammonia and hydrogen peroxide, the method comprising the steps of:

adding an ammonia solution to the liquid mixture to obtain a first ammonia concentration in the liquid mixture of 3.5 wt. %;

cleaning the silicon substrate using the liquid mixture, until the cleaning causes a change in the ammonia concentration to a second ammonia concentration in the liquid mixture of 2.5 wt. %; and repeating the adding and cleaning steps, wherein the liquid mixture provides stable cleaning characteristics and maintains a constant etch rate of the silicon oxide film, and wherein the cleaning is performed under a condition where the liquid mixture is heated and the ammonia volatilizes.

* * * * *